United States Patent
Ding

(10) Patent No.: US 11,930,687 B2
(45) Date of Patent: Mar. 12, 2024

(54) ORGANIC LIGHT EMITTING DIODE DISPLAY DEVICE WITH A BLOCKING MEMBER

(71) Applicant: WUHAN CHINA STAR OPTOELECTRONICS SEMICONDUCTOR DISPLAY TECHNOLOGY CO., LTD., Wuhan (CN)

(72) Inventor: Caihua Ding, Wuhan (IL)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 896 days.

(21) Appl. No.: 16/965,614

(22) PCT Filed: Mar. 16, 2020

(86) PCT No.: PCT/CN2020/079477
§ 371 (c)(1),
(2) Date: Jul. 29, 2020

(87) PCT Pub. No.: WO2021/103349
PCT Pub. Date: Jun. 3, 2021

(65) Prior Publication Data
US 2023/0165121 A1 May 25, 2023

(30) Foreign Application Priority Data
Nov. 25, 2019 (CN) .......................... 201911162758.4

(51) Int. Cl.
*H10K 59/88* (2023.01)
*H10K 59/124* (2023.01)
(Continued)

(52) U.S. Cl.
CPC ........... *H10K 59/88* (2023.02); *H10K 59/124* (2023.02); *H10K 59/131* (2023.02); *H10K 59/40* (2023.02);
(Continued)

(58) Field of Classification Search
CPC .... H10K 59/88; H10K 59/124; H10K 59/131; H10K 59/40; H10K 59/8791; H10K 77/111; H10K 2102/311
(Continued)

(56) References Cited

U.S. PATENT DOCUMENTS

| | | | |
|---|---|---|---|
| 2011/0073847 A1 | 3/2011 | Kobayashi et al. | |
| 2016/0190522 A1* | 6/2016 | Lee | H10K 50/8426 257/40 |
| 2016/0204183 A1* | 7/2016 | Tao | H10K 77/111 438/34 |

FOREIGN PATENT DOCUMENTS

| | | |
|---|---|---|
| CN | 105914224 A | 8/2016 |
| CN | 106298838 A | 1/2017 |

(Continued)

*Primary Examiner* — Quoc D Hoang
(74) *Attorney, Agent, or Firm* — PV IP PC; Wei Te Chung; Zhigang Ma

(57) ABSTRACT

An organic light emitting diode (OLED) display panel and a display device are provided. The OLED display panel includes a light emitting functional layer and a display area disposed on a transistor array substrate. The reinforcement layer is formed on a surface of a bending area of the transistor array substrate. A blocking member is formed on a surface of the transistor array substrate and located between the reinforcement layer and the light emitting functional layer. By providing the blocking member, the control accuracy of the amount of glue overflow in the bending area is improved.

9 Claims, 3 Drawing Sheets

(51) Int. Cl.
   *H10K 59/131*   (2023.01)
   *H10K 59/40*    (2023.01)
   *H10K 59/80*    (2023.01)
   *H10K 77/10*    (2023.01)
   *H10K 102/00*   (2023.01)

(52) U.S. Cl.
   CPC ....... *H10K 59/8791* (2023.02); *H10K 77/111* (2023.02); *H10K 2102/311* (2023.02)

(58) Field of Classification Search
   USPC .......................................................... 257/40
   See application file for complete search history.

(56) References Cited

FOREIGN PATENT DOCUMENTS

| | | |
|---|---|---|
| CN | 107123667 A | 9/2017 |
| CN | 108281576 A | 7/2018 |
| CN | 108962030 A | 12/2018 |
| CN | 109378339 A | 2/2019 |
| CN | 109461382 A | 3/2019 |
| CN | 110931536 A | 3/2020 |

\* cited by examiner

ORGANIC LIGHT EMITTING DIODE DISPLAY DEVICE WITH A BLOCKING MEMBER

BACKGROUND OF INVENTION

Field of Invention

The present invention relates to the field of display technology, and more particularly, to an organic light emitting diode (OLED) display panel and a display device.

Description of Prior Art

In recent years and with improvement of people's requirements for display quality of display panels, in recent years, there has been an increasing demand for high-screen-ratio products. Narrow frame products, such as notched cell phone have been popular, which greatly improves people's visual enjoyment. In order to realize a narrow frame display panel, pad-bending technology needs to be developed to bend the terminal area, but it may cause cracks in the terminal area circuit during bending process, so the display panel is not working or displaying abnormal. Currently, by applying ultraviolet (UV) glue to the bending area of the pad, the bending area of the pad may be reinforced to avoid the cracks in the bending area of the pad during bending. However, due to strong fluidity of UV glue, if a large amount of UV glue is coated on the bending area of the pad, the UV glue will overflow into an active area (AA). As a result, there are bubbles when attaching polarizers (POL). Now, the large amount of UV glue overflow is adjusted by the coating machine, but it is not easy to control overflow of the UV glue, and control accuracy is low.

Therefore, the display panels have a problem in that the accuracy of controlling the large amount of UV glue overflow is not well.

SUMMARY OF INVENTION

An organic light emitting diode (OLED) display panel and a display device are provided, so as to solve the technical problem of low ultraviolet (UV) glue overflow control accuracy in the bending area of the display panel in the prior art.

An OLED display panel comprises:
  a transistor array substrate comprising a plurality of transistors arranged in an array, and the transistor array substrate comprises a display area, a bending area, and a driving area, and the plurality of transistors arranged in the array are disposed in the display area;
  a light emitting functional layer disposed in the display area of the transistor array substrate;
  a driving component disposed in the driving area of the transistor array substrate;
  a plurality of traces disposed in the bending area of the transistor array substrate and electrically connected to the plurality of transistors and the driving component;
  a reinforcement layer formed on a surface of the bending area; and
  a blocking member formed on a surface of the transistor array substrate and located between the reinforcement layer and the light emitting functional layer.

In one embodiment, the blocking member is formed by forming a new added layer on the surface of the transistor array substrate.

In one embodiment, a material of the blocking member comprises one of polyimide, an insulating organic compound, and an insulating inorganic compound.

In one embodiment, the transistor array substrate further comprises a planarization layer, and the planarization layer is patterned to form the blocking member.

In one embodiment, a surface shape of the blocking member is straight or curved.

In one embodiment, a cross-sectional shape of the blocking member comprises one of a rectangle and a trapezoid.

In one embodiment, the blocking member is arranged in multiple columns.

In one embodiment, a material of the reinforcement layer comprises ultraviolet curing glue.

In one embodiment, a height of the reinforcement layer is less than a height of the blocking member.

A display device comprises:
  an organic light emitting diode (OLED) display panel;
  a touch panel disposed on the OLED display panel; and
  a polarizer disposed on the touch panel, and the OLED display panel comprises:
    a transistor array substrate comprising a plurality of transistors arranged in an array, and the transistor array substrate comprises a display area, a bending area, and a driving area, and the plurality of transistors arranged in the array are disposed in the display area;
    a light emitting functional layer disposed in the display area of the transistor array substrate;
    a driving component disposed in the driving area of the transistor array substrate;
    a plurality of traces disposed in the bending area of the transistor array substrate and electrically connected to the plurality of transistors and the driving component;
    a reinforcement layer formed on a surface of the bending area; and
    a blocking member formed on a surface of the transistor array substrate and located between the reinforcement layer and the light emitting functional layer.

In one embodiment, and the blocking member is formed by forming a new added layer on the surface of the transistor array substrate.

In one embodiment, a material of the blocking member comprises one of polyimide, an insulating organic compound, and an insulating inorganic compound.

In one embodiment, the transistor array substrate further comprises a planarization layer, and the planarization layer is patterned to form the blocking member.

In one embodiment, a surface shape of the blocking member is straight or curved.

In one embodiment, a cross-sectional shape of the blocking member comprises one of a rectangle and a trapezoid.

In one embodiment, the blocking member is arranged in a multiple columns.

In one embodiment, a material of the reinforcement layer comprises ultraviolet curing glue.

In one embodiment, a height of the reinforcement layer is less than a height of the blocking member.

In one embodiment, the blocking member is connected to the touch panel.

In one embodiment, the blocking member is not connected to the touch panel.

The present invention has beneficial effects described as follows: an OLED display panel and a display device are provided, and the OLED display panel comprises a blocking member formed on a surface of the transistor array substrate and located between the reinforcement layer and the light emitting functional layer. Moreover, the blocking member is connected to the touch panel, so as to support the touch panel and maintain a stability of the touch panel during bending. One or more blocking members are formed between the reinforcement layer and the light emitting functional layer to prevent the ultraviolet curing glue of the reinforcement layer from overflowing to the display area, thereby effectively controlling the amount of glue overflow, and maintaining the stability of the distribution of ultraviolet curing glue in the bending area. Therefore, the control accuracy of the amount of glue overflow in the bending area is improved.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

DETAILED DESCRIPTION OF PREFERRED EMBODIMENTS

Figure 1:
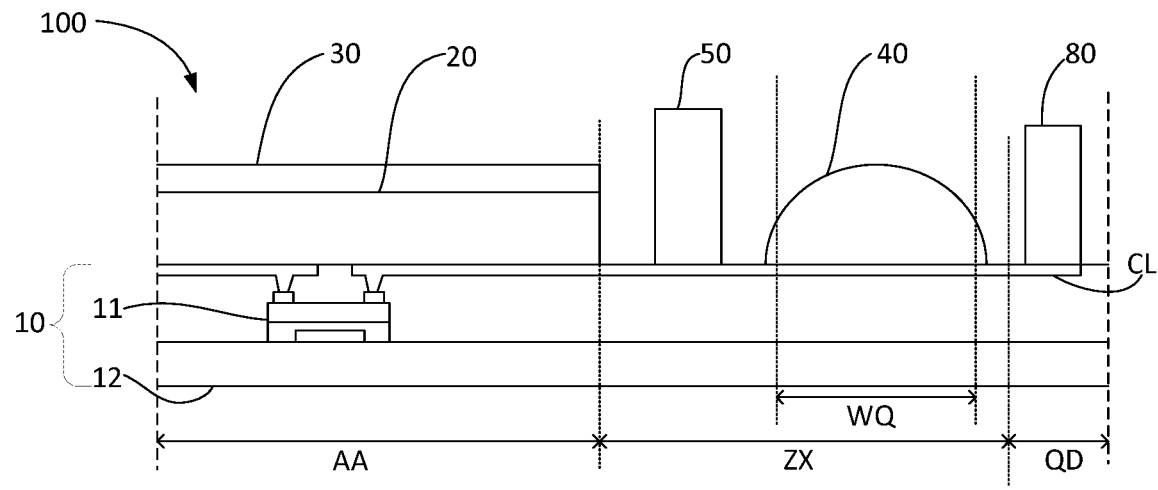
FIG. 1 is a schematic side view of first structure of an organic light emitting diode (OLED) display panel according to one embodiment of the present invention.

Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the drawings, similar components are marked with the same reference numerals.

As for a problem in that the accuracy of controlling the large amount of UV glue overflow is not well, the present invention may solve the problem.

Referring to FIG. 1, an organic light emitting diode (OLED) display panel 100 comprises a transistor array substrate 10 comprising a plurality of transistors 11 arranged in an array, and the transistor array substrate 10 comprises a display area (AA), a bending area (ZX), and a driving area (QD), and the plurality of transistors 11 arranged in the array are disposed in the display area (AA);

a light emitting functional layer 20 disposed in the display area (AA) of the transistor array substrate 10;

a driving component 80 disposed in the driving area (QD) of the transistor array substrate 10;

a plurality of traces (CL) disposed in the bending area (ZX) of the transistor array substrate 10 and electrically connected to the plurality of transistors 11 and the driving component 80;

a reinforcement layer 40 formed on a surface of the bending area (ZX); and a blocking member 50 formed on a surface of the transistor array substrate 10 and located between the reinforcement layer 40 and the light emitting functional layer 20.

Specifically, the OLED display panel 100 further comprises a packaging layer 30 formed on the light emitting functional layer 20.

Furthermore, the transistor array substrate 10 further comprises a flexible substrate 12.

In one embodiment, the reinforcement layer 40 comprises ultraviolet curing glue.

In one embodiment, a material of the blocking member 50 comprises one of polyimide (PI), an insulating organic compound such as acrylic, an insulating inorganic compound such as $SiN_x$ or $SiO_x$. The selected materials have an insulation property and are not reacted with the reinforcement layer 40 such as ultraviolet curing glue, and do not affect the normal working of the reinforcement layer 40.

Referring to FIG. 1, a cross-sectional shape of the blocking member 50 is rectangle.

In one embodiment, the bending area (ZX) comprises a curved region (WQ), and the ultraviolet curing glue of the reinforcement layer 40 covers the curved region (WQ) and exceeds the curved region (WQ), so as to better protect the traces (CL) of the bending area (ZX) from cracking or breaking during bending.

In one embodiment, an OLED display panel is provided. By forming a blocking member between the reinforcement layer and the light emitting function layer in the OLED display panel, the ultraviolet curing glue of the reinforcement layer is prevented from overflowing to the display area, thereby effectively controlling the amount of glue overflow, and maintaining the stability of the distribution of ultraviolet curing glue in the bending area. Therefore, the control accuracy of the amount of glue overflow in the bending area is improved.

Figure 2:
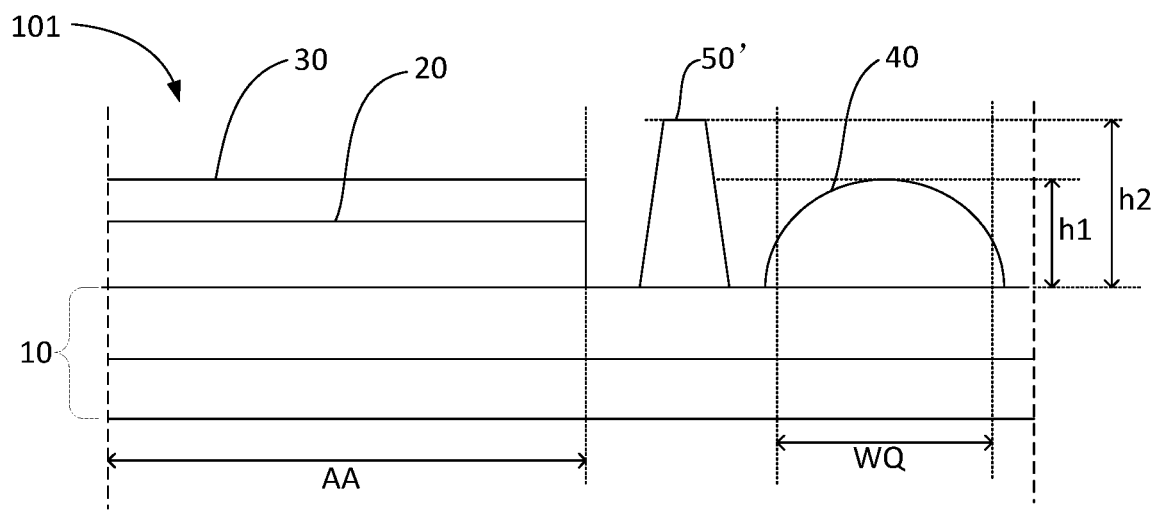
FIG. 2 is a schematic side view of a part of second structure of the OLED display panel according to one embodiment of the present invention.

Referring to FIG. 2, it is a schematic side view of a part of second structure of the OLED display panel according to one embodiment of the present invention. Details of the driving component 80 and the transistor array substrate 10 are not shown. The OLED display panel 101 comprises a blocking member 50'. The difference from the previous embodiments is that the blocking member 50' has a trapezoidal cross-sectional shape. Specifically, the cross-sectional shape of the blocking member may be one of a rectangle, a trapezoid, or other polygons. The cross-sectional shape of this embodiment is a trapezoid.

In one embodiment, the blocking member is formed by forming a new added layer on a surface of the transistor array substrate 10 and located between the reinforcement layer 40 and the light emitting functional layer 20. In another embodiment, the blocking member and some other layers of the OLED display panel may be formed simultaneously.

Figure 3:
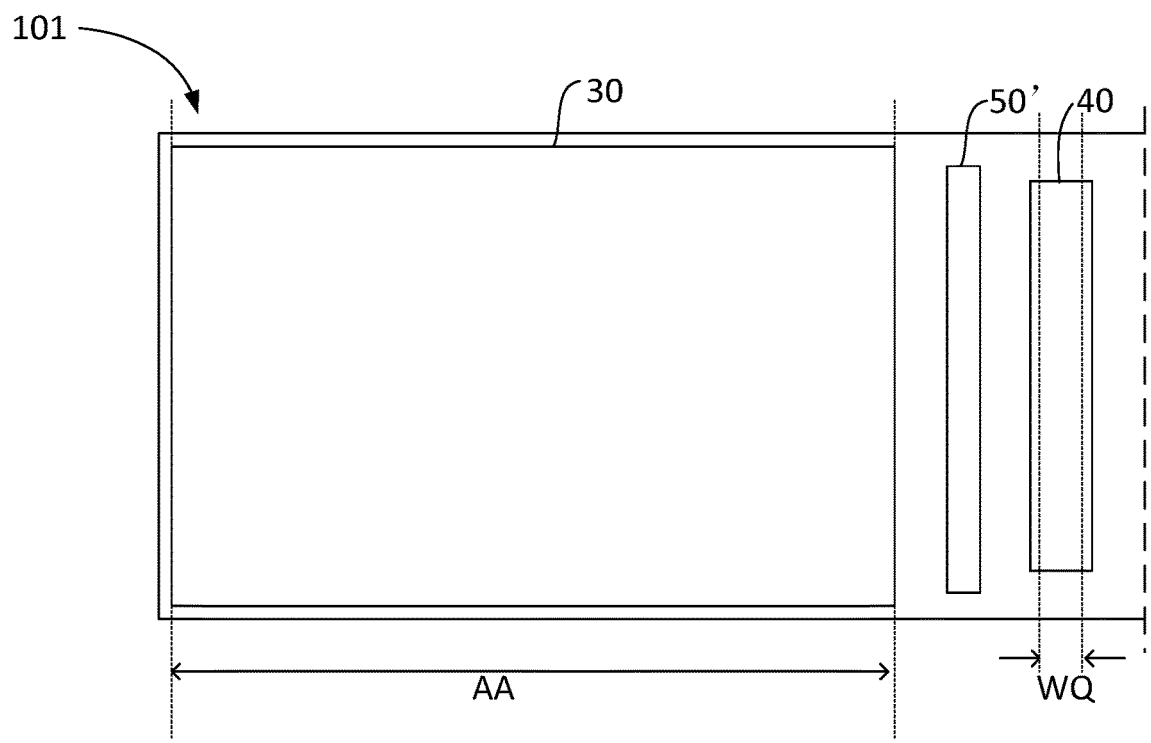
FIG. 3 is a schematic partial bottom view of the OLED display panel of FIG. 2.

Referring to FIG. 3, it is a schematic partial bottom view of the OLED display panel 101. Details of the driving component 80 and the transistor array substrate 10 are not shown. In one embodiment, a surface of the blocking member 50' is straight or curved. The surface of the blocking member 50 in this embodiment is straight.

Figure 4:
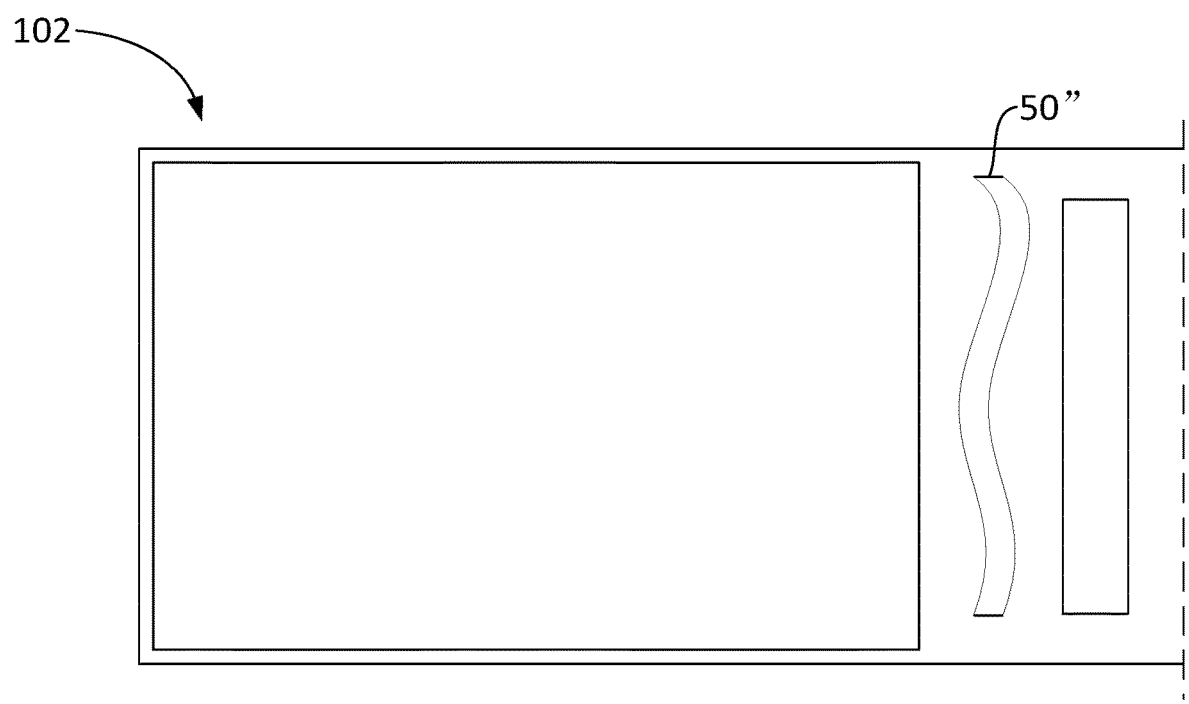
FIG. 4 is a schematic bottom view of a part of third structure of the OLED display panel according to one embodiment of the present invention.

Referring to FIG. 4, in another embodiment, the surface of the blocking member 50" of the OLED display panel 102 has a curved shape.

In one embodiment, the blocking member 50' may be arranged in one column or multiple columns. In this embodiment, the blocking member 50' is arranged in one column as shown in FIG. 2.

In one embodiment, the blocking member may be formed by one of processes such as chemical vapor deposition (CVD) or inkjet printing (IJP). In this embodiment, the blocking member is formed by inkjet printing.

Specifically, inkjet printing is a film-forming method in which inks of functional materials are ejected drop-by-drop to corresponding positions as needed under computer control, so as to form a pattern. It has advantages such as simple operation, non-contact, no mask, low equipment cost, and high material utilization. It is considered to be an effective way to realize flexible large-area displays. Therefore, the blocking member is formed by inkjet printing, so that the height and width of the blocking member may be accurately controlled by the process conditions to achieve high accuracy and low cost.

Specifically, the ultraviolet curing glue of the reinforcement layer 40 may be formed on the surface of the curved region (WQ) by coating, and a height (h1) of the ultraviolet curing glue coated on the surface of the curved region (WQ) is less than a height (h2) of the blocking member 50', and the height (h2) of the blocking member 50' are determined by the height (h1) of the ultraviolet curing glue to be coated in the curved region as shown in FIG. 2.

Specifically, the ultraviolet curing glue has fluidity characteristics. When the ultraviolet curing glue is applied, the blocking member 50' is blocking, and the height (h2) of the blocking member 50' is greater than the height (h1) of the ultraviolet curing glue, so that it prevents the ultraviolet curing glue from overflowing into the display area and affecting the subsequent process.

Specifically, a distance between the blocking member and the ultraviolet curing glue may be determined by the ultraviolet curing glue to be applied to the curved region. A distance between the blocking member and the display area may be determined by the light emitting functional layer according to actual needs.

Referring to FIG. 2, the OLED display panel 101 further comprises a packaging layer 30 formed on the light emitting functional layer 20. The packaging layer 30 is a packaging film and comprises a first inorganic packaging layer, a first organic packaging layer, and a second inorganic packaging layer (not shown) that are stacked.

Figure 5:
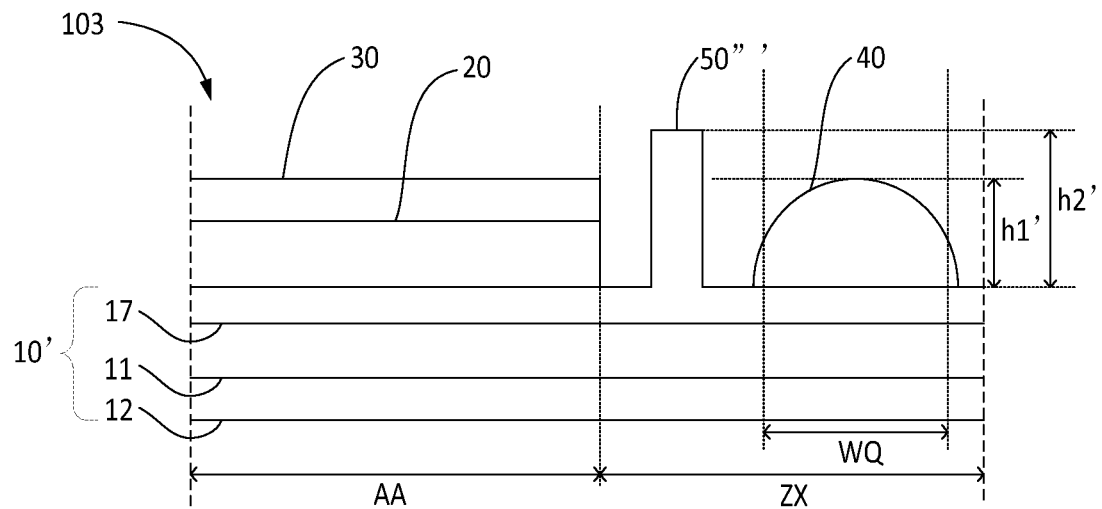
FIG. 5 is a schematic side view of a part of fourth structure of the OLED display panel according to one embodiment of the present invention.

Referring to FIG. 5, the OLED display panel 103 comprises a transistor array substrate 10', a light emitting functional layer 20, and a packaging layer 30. The transistor array substrate 10' further comprises a flexible substrate 12 and a planarization layer 17.

In one embodiment, a material of the flexible substrate 12 comprises polyimide or other flexible polymers. The flexible substrate in this embodiment is made of polyimide.

In one embodiment, the planarization layer 17 is a top layer of the transistor array substrate 10, and the planarization layer 17 extends from the display area (AA) of the transistor array substrate 10 to the bending area (ZX).

Specifically, the material of the planarization layer comprises polyimide or other organic compounds, and the planarization layer in this embodiment is made of polyimide.

Specifically, the planarization layer may be deposited on the transistor array substrate by chemical vapor deposition.

In one embodiment, the planarization layer 17 is patterned to form a convex blocking member 50''', and the blocking member 50''' is located between the curved region (WQ) and the display area (AA) of the transistor array substrate.

Specifically, the blocking member 50' is located between the reinforcement layer 40 and the light emitting functional layer 20.

In one embodiment, a surface shape of the blocking member 50''' is straight or curved.

In one embodiment, a cross-sectional shape of the blocking member 50''' is one of a rectangle, a trapezoid, or other polygons. In this embodiment, the cross-sectional shape of the blocking member 50''' is rectangle as shown in FIG. 5.

In one embodiment, the blocking member 50''' is arranged in a column or multiple columns. In this embodiment, the blocking member 50''' is arranged in a column as shown in FIG. 5.

In one embodiment, a reinforcement layer 40 is formed on a surface of the curved region (WQ), and the reinforcement layer 40 is used for structural reinforcement of the curved region (WQ). Cracks or breakage of internal wiring in the curved region (WQ) may cause the OLED display panel 103 failure or to display abnormal. The reinforcement layer 40 may avoid cracks or breakage of internal wiring in the curved region (WQ) during the bending.

Specifically, the reinforcement layer 40 comprises ultraviolet curing glue, and the ultraviolet curing glue may be formed on the surface of the curved region by coating, and a height (h1') of the ultraviolet curing glue coated on the surface of the curved region is less than a height (h2') of the blocking member 50''', and the height (h2') of the blocking member 50''' are determined by the height (h1') of the ultraviolet curing glue to be coated in the curved region as shown in FIG. 5.

Specifically, the ultraviolet curing glue has fluidity characteristics. When the ultraviolet curing glue is applied, the blocking member 50' is blocking, and the height (h2') of the blocking member 50''' is greater than the height (h1') of the ultraviolet curing glue, so that it prevents the ultraviolet curing glue from overflowing into the display area and affecting the subsequent process.

Specifically, a distance between the blocking member and the ultraviolet curing glue may be determined by the ultraviolet curing glue to be applied to the curved region. A distance between the blocking member and the light emitting functional layer may be determined by the light emitting functional layer according to actual needs.

In one embodiment, the packaging layer 30 is a packaging film and comprises a first inorganic packaging layer, a first organic packaging layer, and a second inorganic packaging layer (not shown) that are stacked.

Figure 6:
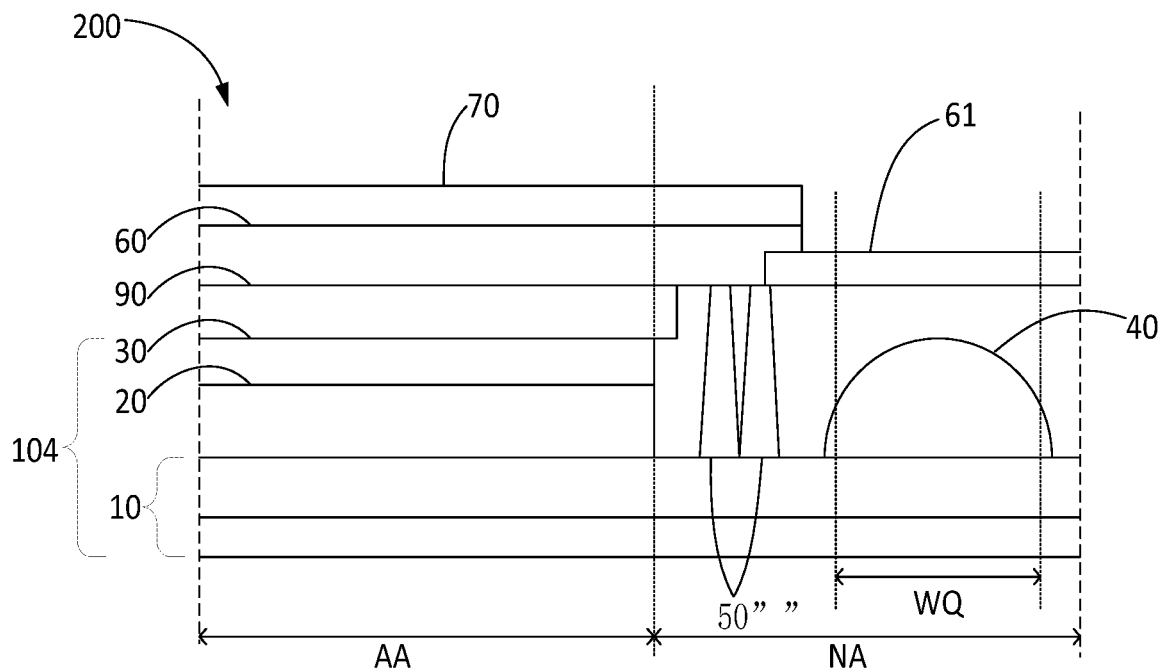
FIG. 6 is a schematic side view of a structure of a display device according to one embodiment of the present invention.

Referring to FIG. 6, a display device 200 is provided in one embodiment. The display device comprises an organic light emitting diode (OLED) display panel 104, a touch panel 60 disposed on the OLED display panel 104, and a polarizer 70 disposed on the touch panel 60.

In one embodiment, the OLED display panel of the display device 200 may be one of the above-mentioned OLED display panels. Herein, the OLED display panel 104 shown in FIG. 6 comprises:

a transistor array substrate 10 comprising comprises a display area and a non-display area;

a light emitting functional layer 20 disposed in the display area (AA) of the transistor array substrate 10;

a reinforcement layer 40 formed on a surface of the curved region (WQ); and a blocking member 50''' formed on a surface of the transistor array substrate 10 and located between the reinforcement layer 40 and the light emitting functional layer 20

In one embodiment, the blocking member 50'''' may be formed by chemical vapor deposition or inkjet printing. The blocking member 50'''' is a new added layer formed on the surface of the transistor array substrate 10.

In one embodiment, a surface shape of the blocking member 50'''' is straight or curved.

In one embodiment, a cross-sectional shape of the blocking member 50'''' is one of a rectangle, a trapezoid, or other polygons. In this embodiment, the cross-sectional shape of the blocking member 50'''' is trapezoid as shown in FIG. 6.

In one embodiment, the blocking member 50'''' is arranged in multiple columns. In this embodiment, the blocking member 50'''' is arranged in two columns as shown in FIG. 6.

In one embodiment, the reinforcement layer 40 comprises ultraviolet curing glue, and the ultraviolet curing glue may be formed on the surface of the curved region (WQ) by coating, and a height of the ultraviolet curing glue coated on the surface of the curved region (WQ) is less than a height of the blocking member 50'''', and the height of the blocking member 50'''' are determined by the height of the ultraviolet curing glue to be coated in the curved region.

Specifically, the ultraviolet curing glue has fluidity characteristics. When the ultraviolet curing glue is applied, the blocking member 50'''' is blocking, and the height of the blocking member 50'''' is greater than the height of the ultraviolet curing glue, so that it prevents the ultraviolet curing glue from overflowing into the display area and affecting the subsequent process.

Specifically, a distance between the blocking member and the ultraviolet curing glue may be determined by the ultraviolet curing glue to be applied to the curved region. A distance between the blocking member and the light emitting functional layer may be determined by the light emitting functional layer according to actual needs.

In one embodiment, the touch panel 60 is attached to the OLED display panel 104 through the pressure sensitive adhesive 90, and the top surface of the blocking member 50'''' is connected to the touch panel 60 to support the touch panel 60.

In one embodiment, the touch panel 60 further comprises a peripheral flexible printed circuit (FPC) 61. The flexible printed circuit 61 may be bent together with the curved region (WQ) of the OLED display panel 104.

In one embodiment, the blocking member 50'''' is connected to the touch panel 60, which effectively prevents the substrate of the flexible printed circuit 61 from cracking during the bending, so as to keep the stability of the touch panel 60.

In one embodiment, if it does not need to consider a supporting function of the blocking member on the touch panel, the blocking member only needs to ensure that the ultraviolet curing glue may not effectively overflow to the display area. Therefore, the blocking member may not be connected to the touch panel.

In one embodiment, the polarizer 70 may be attached to the touch panel 60 by pressure sensitive adhesive (not shown).

In the display device provided in this embodiment, a blocking member is formed between the reinforcement layer and the light emitting functional layer. A height of the blocking member is greater than that of the ultraviolet curing glue of the reinforcement layer, and the blocking member is connected to the touch panel. The blocking member blocks the overflow of glue in the process of coating the ultraviolet curing glue, so as to maintain the uniformity of the amount of glue. Also, the blocking member effectively prevents the ultraviolet curing glue from overflowing into the display area and affecting the subsequent process. At the same time, the blocking member supports the touch panel and maintains its stability during bending.

In one embodiment, the blocking member may also be made into an adhesive tape, a tape-reel type, and manually attached between the reinforcement layer and the light emitting functional layer of the OLED display panel.

In one embodiment, a method of manufacturing an organic light emitting diode (OLED) display panel comprises following steps:

step S1: forming a transistor array substrate, and the step S1 comprises providing a flexible substrate and sequentially forming a buffer layer, an active layer, a gate insulating layer, a gate, an interlayer insulating layer, a source/drain layer and a planarization layer on the flexible substrate;

step S2: forming a light emitting functional layer, and the step S2 comprises forming a pixel electrode layer, a pixel definition layer, a light emitting layer, and a cathode layer on the transistor array substrate in order;

step S3: forming a blocking member, and the step S2 comprises forming the blocking member between the light emitting functional layer and a bending area on the transistor array substrate by inkjet printing;

step S4: forming a reinforcement layer, and the step S4 comprises forming the reinforcement layer on the bending area of the transistor array substrate; and step S5: forming a packaging layer, and the step S5 comprises forming the packaging layer on the light emitting functional layer.

Specifically, in the step S4, the reinforcement layer comprises ultraviolet curing glue.

Specifically, in the step S3, the blocking member is formed between the reinforcement layer and the light emitting functional layer.

Specifically, in the step S3, a material of the blocking member comprises one of polyimide, an insulating organic compound, and an insulating inorganic compound. The selected materials have an insulation property and are not reacted with the reinforcement layer such as ultraviolet curing glue, and do not affect the normal working of the ultraviolet curing glue.

Specifically, in step S3, a surface shape of the blocking member is straight or curved.

Specifically, in step S3, a cross-sectional shape of the blocking member comprises one of a rectangle and a trapezoid.

Specifically, in step S3, the blocking member is arranged in one column or multiple columns.

Specifically, in step S3, a height of the blocking member is greater than that of the ultraviolet curing glue of the reinforcement layer, and a distance between the blocking member and the ultraviolet curing glue may be determined by the ultraviolet curing glue to be coated in the bending area according to actual needs. A distance between the blocking member and the light emitting functional layer may be determined by the light emitting functional layer according to the actual needs.

Accordingly, in the above-mentioned embodiment, an OLED display panel, a method of manufacturing thereof, and a display device are provided. A blocking member is formed between the reinforcement layer and the light emitting functional layer. A height of the blocking member is greater than that of the ultraviolet curing glue of the reinforcement layer, and the blocking member is connected to the touch panel. The blocking member blocks the overflow of glue in the process of coating the ultraviolet curing glue, so as to maintain the uniformity of the amount of glue. Also, the blocking member effectively prevents the ultraviolet curing glue from overflowing into the display area and affecting the subsequent process. At the same time, the blocking member supports the touch panel and maintains its stability during bending.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display device, comprising:
an organic light emitting diode (OLED) display panel;
a touch panel disposed on the OLED display panel; and
a polarizer disposed on the touch panel;
wherein the OLED display panel comprises:
a transistor array substrate comprising a plurality of transistors arranged in an array, wherein the transistor array substrate comprises a display area, a bending area, and a driving area, and the plurality of transistors arranged in the array are disposed in the display area;
a light emitting functional layer disposed in the display area of the transistor array substrate;
a driving component disposed in the driving area of the transistor array substrate;
a plurality of traces disposed in the bending area of the transistor array substrate and electrically connected to the plurality of transistors and the driving component;
a reinforcement layer formed on a surface of the bending area; and
a blocking member formed on a surface of the transistor array substrate and located between the reinforcement layer and the light emitting functional layer;
wherein the blocking member is connected to the touch panel.

2. The OLED display panel according to claim 1, wherein the blocking member is formed by forming a new added layer on the surface of the transistor array substrate.

3. The OLED display panel according to claim 2, wherein a material of the blocking member comprises one of polyimide, an insulating organic compound, and an insulating inorganic compound.

4. The OLED display panel according to claim 1, wherein the transistor array substrate further comprises a planarization layer, and the planarization layer is patterned to form the blocking member.

5. The OLED display panel according to claim 1, wherein a surface shape of the blocking member is straight or curved.

6. The OLED display panel according to claim 1, wherein a cross-sectional shape of the blocking member comprises one of a rectangle and a trapezoid.

7. The OLED display panel according to claim 1, wherein the blocking member is arranged in multiple columns.

8. The OLED display panel according to claim 1, wherein a material of the reinforcement layer comprises ultraviolet curing glue.

9. The OLED display panel according to claim 8, wherein a height of the reinforcement layer is less than a height of the blocking member.

* * * * *